(12) United States Patent
Abrial et al.

(10) Patent No.: US 10,157,475 B2
(45) Date of Patent: Dec. 18, 2018

(54) COMPONENT HANDLING ASSEMBLY AND METHOD OF ADJUSTING A COMPONENT HANDLING ASSEMBLY

(71) Applicant: ISMECA SEMICONDUCTOR HOLDING SA, La Chaux-de-Fonds (CH)

(72) Inventors: Pierrick Abrial, Neuchâtel (CH); Damien Coste, Le Locle (CH); Marco Oberli, La Chaux-de-Fonds (CH); Patrice Schwindenhammer, Gilley (FR)

(73) Assignee: ISMECA SEMICONDUCTOR HOLDING SA, La Chaux-de-Fonds (CH)

( * ) Notice: Subject to any disclaimer, the term of this patent is extended or adjusted under 35 U.S.C. 154(b) by 0 days.

(21) Appl. No.: 15/545,262

(22) PCT Filed: Apr. 12, 2016

(86) PCT No.: PCT/IB2016/052059
§ 371 (c)(1),
(2) Date: Jul. 20, 2017

(87) PCT Pub. No.: WO2016/185298
PCT Pub. Date: Nov. 24, 2016

(65) Prior Publication Data
US 2018/0253859 A1    Sep. 6, 2018

(30) Foreign Application Priority Data
May 19, 2015  (CH) .................................. 0693/15

(51) Int. Cl.
*G06T 7/70*    (2017.01)
*H04N 5/225*   (2006.01)
(Continued)

(52) U.S. Cl.
CPC ................ *G06T 7/70* (2017.01); *G06T 7/001* (2013.01); *H04N 5/2256* (2013.01);
(Continued)

(58) Field of Classification Search
CPC . G06T 7/001; G06T 7/70; G06T 2207/30164; G06T 7/73;
(Continued)

(56) References Cited

U.S. PATENT DOCUMENTS

| 5,157,734 A | 10/1992 | Chen et al. |
| 2005/0104017 A1 | 5/2005 | Kimba et al. |
| 2010/0033706 A1* | 2/2010 | Shindo .............. H01L 21/67259 355/74 |

FOREIGN PATENT DOCUMENTS

| WO | 2011/076507 A1 | 6/2011 |
| WO | 2014/209226 A1 | 12/2014 |

* cited by examiner

*Primary Examiner* — Kenny A Cese
(74) *Attorney, Agent, or Firm* — Maschoff Brennan

(57) ABSTRACT

According the present invention there is provided a method for adjusting a component handling assembly, the component handling assembly comprising, a plurality of stations at least some of which have a nest which can receive a component, and a rotatable turret having a plurality of component handling heads, and wherein the turret can rotate to transport components between the plurality of stations, the method comprising the steps of, capturing a first image of a reference element located at a first station, using a camera which is located on the rotatable turret; identifying the position in the first image of the center of the reference element; rotating the turret so that the camera on the turret is in a position where it can capture a second image of nest of a second station; capturing a second image of the nest of the second station, using said camera; identifying the position in the second image of the center of the nest of the (Continued)

second station; superimposing a marker on the second image at the same position as the position of the center of the reference element in the first image; adjusting the second station until the position in the second image of the center of the nest of the second station is aligned with the marker. There is further provided a corresponding component handling assembly.

16 Claims, 9 Drawing Sheets

(51) Int. Cl.
    *G06T 7/00*         (2017.01)
    *H05K 13/04*     (2006.01)
    *G06T 7/73*         (2017.01)

(52) U.S. Cl.
    CPC ............... *H05K 13/04* (2013.01); *G06T 7/73* (2017.01); *G06T 2207/30164* (2013.01); *G06T 2207/30204* (2013.01); *H01J 2237/2817* (2013.01); *H01J 2237/2826* (2013.01); *H01J 2237/30438* (2013.01)

(58) Field of Classification Search
    CPC ......... G06T 2207/30204; G05B 19/402; H01J 2237/2817; H01J 2237/2826; H01J 2237/30438; H04N 5/2256; H05K 13/04
    See application file for complete search history.

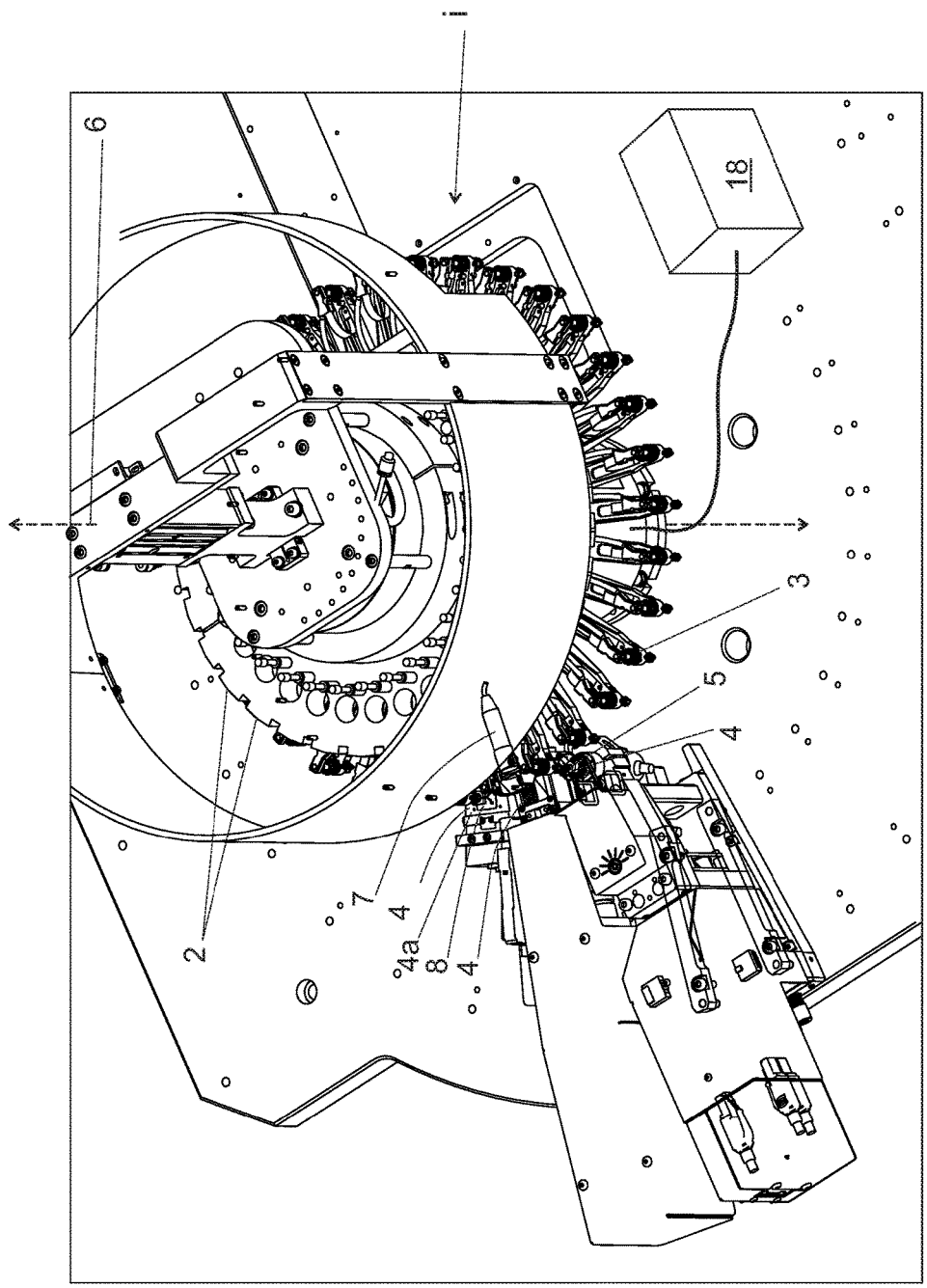

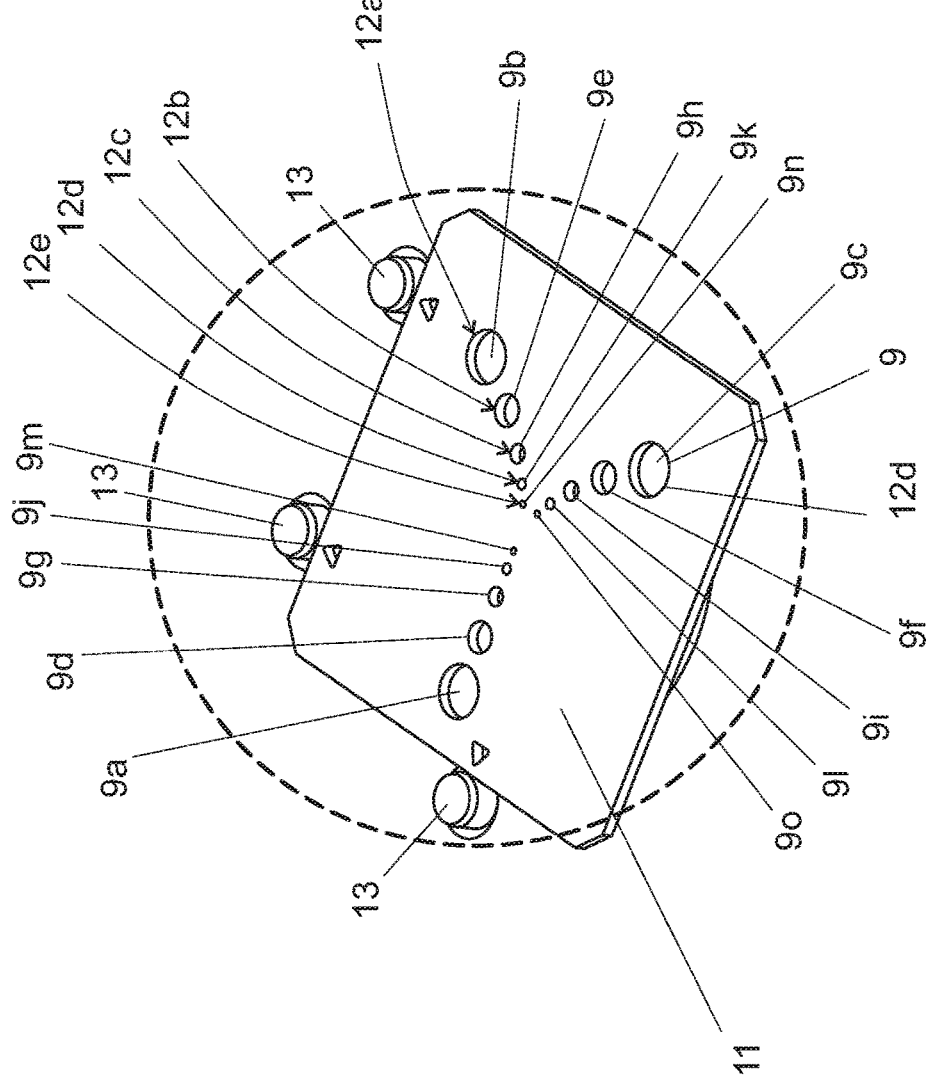

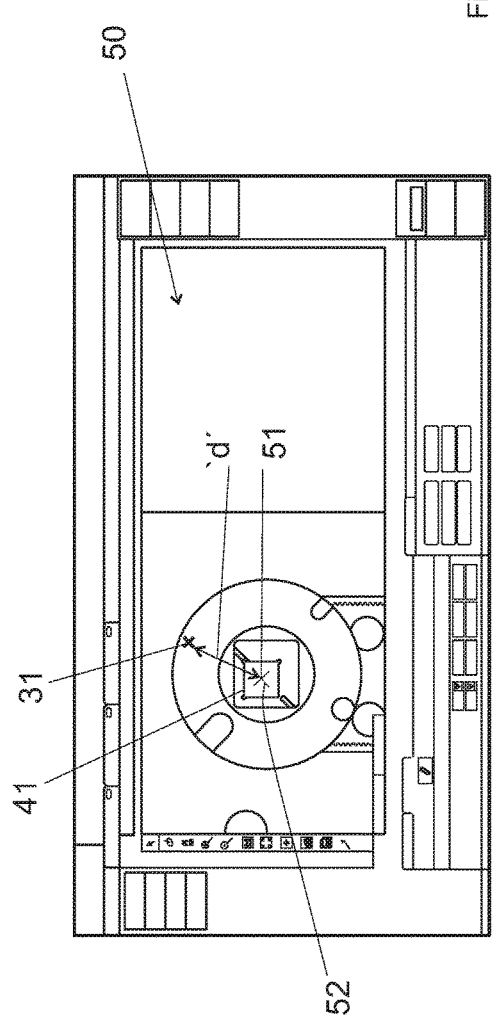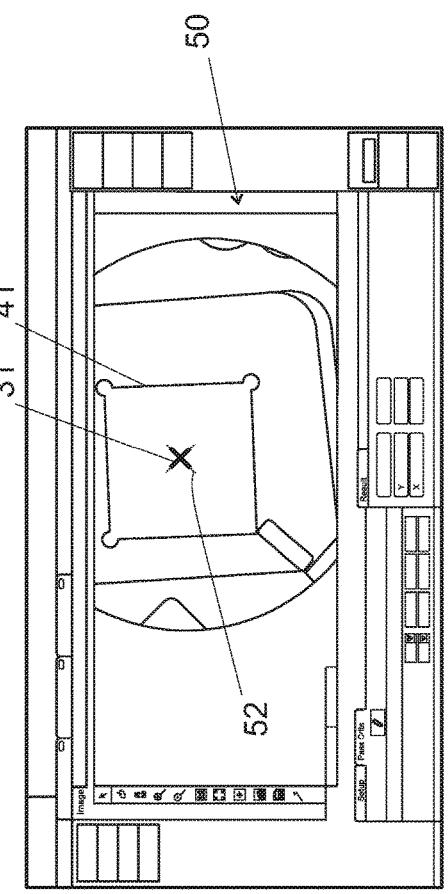

COMPONENT HANDLING ASSEMBLY AND METHOD OF ADJUSTING A COMPONENT HANDLING ASSEMBLY

FIELD OF THE INVENTION

The present invention concerns a component handling assembly and a method for adjusting a component handling assembly which involves the use of a vision system to determine a reference position at a station which comprises a reference element, and then using the determined reference position to adjust subsequent stations of the component handling assembly.

DESCRIPTION OF RELATED ART

Component handling assemblies usually comprises a rotatable turret which comprises a plurality of component handling heads each of which can hold a component. Beneath turret is typically located a plurality of stations each of which can process or test a component in some way. The turret rotates to move the components between the stations and the component handling heads operate to pick and place components from/into the respective stations.

In order for the component handling heads on the turret to pick and place components from/into the respective stations the respective stations need to be centred under respective component handling heads. Disadvantageously the adjustment of the plurality of stations so that they are centred under respective component handling heads on the turret is labour intensive and time consuming. Also disadvantageously existing solutions do not allow stations to be accurately centred under respective the component handling heads.

It is an aim of the present invention to mitigate at least some of the above-mentioned disadvantages.

BRIEF SUMMARY OF THE INVENTION

According to the invention, there is provided a method for adjusting a component handling assembly, the component handling assembly comprising, a plurality of stations at least some of which have a nest which can receive a component, and a rotatable turret having a plurality of component handling heads, and wherein the turret can rotate to transport components between the plurality of stations, the method comprising the steps of, capturing a first image of a reference element located at a first station, using a camera which is located on the rotatable turret;

identifying the position in the first image of the centre of the reference element;

rotating the turret so that the camera on the turret is in a position where it can capture a second image of nest of a second station;

capturing a second image of the nest of the second station, using said camera;

identifying the position in the second image of the centre of the nest of the second station;

superimposing a marker on the second image at the same position as the position of the centre of the reference element in the first image;

adjusting the second station until the position in the second image of the centre of the nest of the second station is aligned with the marker.

Preferably the camera is located between consecutive component handling heads on the turret. Thus the step of rotating the turret so that the camera on the turret is in a position where it can capture a second image of nest of a second station may comprise the step of rotating the turret a distance which is half the distance between consecutive component handling heads on the turret.

Preferably the method comprises the steps of, for each of a plurality of stations which each comprise a nest:

capturing a second image of the nest of that station, using said camera;

identifying the position in the second image of the centre of the nest of the station;

superimposing a marker on the second image at the same position as the position of the centre of the reference element in the first image;

adjusting the station until the position in the second image of the centre of the nest of the station is aligned with the marker.

Preferably the second image is an image frame in a live video of the second station, and preferably said step of superimposing a marker on the second image comprises superimposing a marker on each of the image frames in the live video at the same position as the position of the centre of the reference element in the first image.

Preferably the first and second images have the same field of view.

The step of adjusting the second station until the position in the second image of the centre of the nest of the second station is aligned with the marker, may comprise the step of using an x-y table to move the nest of the second station so that the centre of the nest of the second station is aligned with the marker.

Preferably the second station is adjusted automatically until the position in the second image of the centre of the nest of the second station is aligned with the marker; for example the second station may comprise a processor which can operate an x-y table to move the nest of the second station so that the centre of the nest of the second station is aligned with the marker.

The method may further comprise the step of determining the distance between the marker superimposed on the second image and the position in the second image of the centre of the nest of the second station, to estimate a positioning error of the second station.

The reference element may comprise a plate member having a plurality of holes defined therein, and the step of identifying the position in the first image of the centre of the reference element may comprise, identifying the position in the first image of the plurality of holes;

performing a geometrical calculation to locate a point in the first image which is equidistance from each of the plurality of holes, wherein said located point defines the centre of the reference element.

The plate member may comprises a plurality of groups of holes, the holes of each group having equal dimensions, the dimensions of the holes differing between groups, and the step of identifying the position in the first image of the centre of the reference element may further comprise, selecting from the plurality of groups of holes, a group of holes on which to perform said geometrical calculation.

The step of identifying the position in the first image of the plurality of holes may comprise, performing grey scale analysis of the first image. The step of performing grey scale analysis of the first image may comprise, providing the grey level of each pixel in the first image; identifying, based on the grey levels of the pixels, the perimeters of the holes in the first image.

The step of identifying the position in the second image of the centre of the nest of the second station may comprise, performing grey scale analysis of the second image.

The step of identifying the position in the second image of the centre of the nest of the second station may comprise the steps of, providing the grey level of each pixel in the second image;

identifying, based on the grey levels of the pixels, the perimeter of the nest in the second image;

performing a geometrical calculation to determine a point which is at the centre of the identified perimeter, wherein the determined point defines the centre of the nest.

The first station comprises a bin. Preferably the first station comprises a multifunctional bin.

The first station may comprise a fixed set of pins which define a predefined position for the reference element, and the method may further comprise the step of positioning a reference element at the first station so that the reference element abuts a fixed set of pins of the first station so that the reference element is in said predefined position.

The method may further comprise the step of positioning a reference element on the bin so that the reference element overlays an input of the bin.

The method may further comprise the steps of, capturing a third image of a reference element located at a first station, using the camera which is located on the rotatable turret;

identifying the position in the third image of the centre of the reference element;

superimposing a marker on the third image at the same position as the position of the centre of the reference element in the first image, determining if the camera has become displaced during the period between when the first image captured and when the third image was captured based on whether the superimposed marker is aligned with the position in the third image of the centre of the reference element.

The method may further comprise the step of: if the superimposed marker is not aligned with the position in the third image of the centre of the reference element then repeating the steps of, capturing a first image of a reference element located at a first station, using a camera which is located on the rotatable turret;

identifying the position in the first image of the centre of the reference element;

rotating the turret so that the camera on the turret is in a position where it can capture a second image of nest of a second station;

capturing a second image of the nest of the second station, using said camera;

identifying the position in the second image of the centre of the nest of the second station;

superimposing a marker on the second image at the same position as the position of the centre of the reference element in the first image;

adjusting the second station until the position in the second image of the centre of the nest of the second station is aligned with the marker.

Preferably the component handling head is configured such that it can extend from the turret along an axis, and the method may further comprise the step of adjusting the position of a component handling head so that the axis along which the component handling head can extend intersects the centre of the reference element.

The method may further comprise the step of calibrating a component handling head on the turret by, holding a component which has a predefined dimension using the component handling head to be calibrated;

operating a light emitter at a station beneath the component handling head so that it emits a light beam which is received by a light receiver at the station, wherein the light beam is arranged to be at a predefined height above a surface of the station;

advancing the component handling head towards a station only until the component intersects the light beam to block the light beam from passing from the light emitter to the light receiver;

setting the component handling assembly so that the component handling head is prevented from advancing beyond the position where the component which it held intersected the light beam.

According to a further aspect of the present invention there is provided a component handling assembly comprising, a plurality of stations at least some of which have a nest which can receive a component, wherein the plurality of stations include a first station which comprises a reference element and a second station which comprises a nest;

a rotatable turret having a plurality of component handling heads, wherein the turret can rotate to transport components between the plurality of stations;

a camera which is located on the rotatable turret;

a processor which is configured to,
  (a) initiate the camera to capture a first image of a reference element located at a first station;
  (b) identify the position in the first image of the centre of the reference element;
  (c) initiate the turret to rotate so that the camera on the turret is in a position where it can capture a second image of nest of a second station;
  (d) initiate the camera to capture a second image of nest of the second station;
  (e) identify the position in the second image of the centre of the nest of the second station;
  (f) superimpose a marker on the second image at the same position as the position of the centre of the reference element in the first image, so that the user can identify how the second station should be adjusted so that the position in the second image of the centre of the nest of the second station is aligned with the marker.

It should be understood that the processor could be configured to perform and/or initiate the performance of any one or more of the above-mentioned method steps. For example the processor may be configured to perform or initiate the performance of grey scale image analysis to identify the location of the holes of the reference element in the first image and/or to identify the location of the centre of the nest in the second image. As a further example the processor which is further configured to operate an x-y table on which the nest of the second station is supported, so as to move the nest of the second station so that the centre of the nest of the second station is aligned with the marker.

The camera is preferably located on the turret between consecutive component handling heads.

The reference element may comprises a plate member having a plurality of holes defined therein, wherein the holes are arranged such that there are equidistance from a point which defines the centre of the reference element.

The plate member may comprise a plurality of groups of holes, the holes of each group having equal dimensions, the dimensions of the holes differing between groups.

The reference element may be located at the first station so that the reference element abuts a fixed set of pins of the first station.

The first station may comprise a bin. The reference element may be further arranged so that it overlays an input of the bin.

The processor may be further configured to, initiate the camera to capture a third image of a reference element located at a first station;

identify the position in the third image of the centre of the reference element;

superimpose a marker on the third image at the same position as the position of the centre of the reference element in the first image, determine if the camera has become displaced during the period between when the first image captured and when the third image was captured based on whether the superimposed marker is aligned with the position in the third image of the centre of the reference element.

The processor which is further configured to repeat steps (a)-(f) mentioned above if the superimposed marker is not aligned with the position in the third image of the centre of the reference element.

BRIEF DESCRIPTION OF THE DRAWINGS

The invention will be better understood with the aid of the description of an embodiment given by way of example and illustrated by the figures, in which:

FIG. 1a shows a perspective view of a component handling assembly according to an embodiment of the present invention;

FIG. 1b provides a magnified view of some of the component handling heads and of some of the plurality of stations in the assembly of FIG. 1a;

FIG. 1c provides a magnified view of the reference element of the assembly of FIGS. 1a and 1b.

FIGS. 5a and 5b illustrate a second image of the third station captured by the camera when the turret is in the position illustrated in FIG. 4, with the centre of the next marked with a second "x" marker and having the first "x" marker superimposed on the image;

DETAILED DESCRIPTION OF POSSIBLE EMBODIMENTS OF THE INVENTION

FIG. 1a shows a perspective view of a component handling assembly 1 according to an embodiment of the present invention.

The component handling assembly 1 comprises a rotatable turret 2 which is selectively operable to rotate about a rotation axis 6. The rotatable turret 2 comprises a plurality of component handling heads 3 each of which can hold a component preferably by vacuum. The plurality of component handling heads 3 are equally spaced around the rotation axis 6.

Figure 1B:
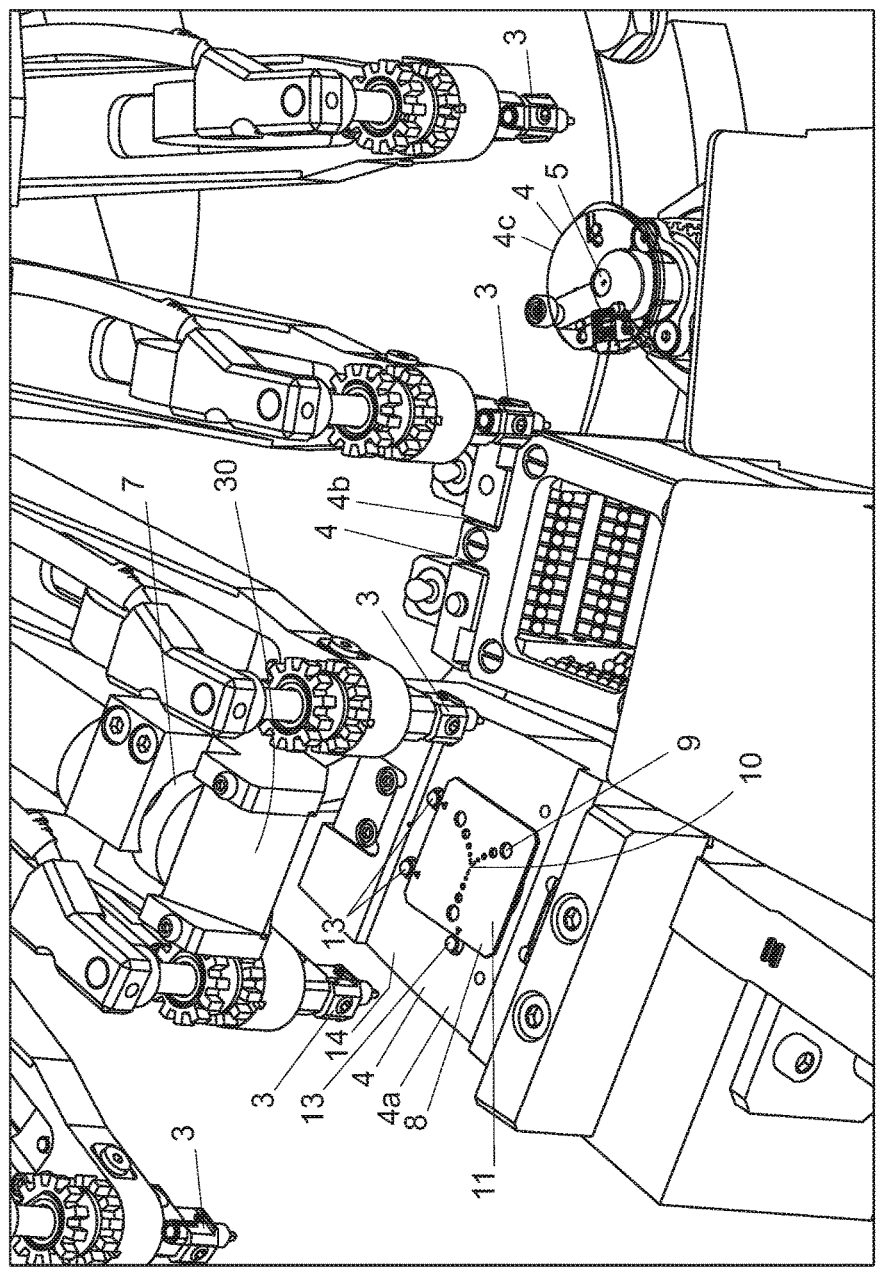

A plurality of stations 4 are located beneath successive component handling heads 3; in FIG. 1a only three stations 4 are illustrated however it will be understood that the component handling assembly 1 may comprise any number of stations 4. At least some of the stations 4 comprise a nest 5 on which a component can be supported. FIG. 1b provides a magnified view of some of the component handling heads 3 and of some of the plurality of stations 4 in the assembly 1 of FIG. 1a; a nest 5 is provided on one of the stations 4. The turret 2 can rotate to transport components, which are held by the plurality of component handling heads 3, between the plurality of stations 4.

As can be more clearly seen from FIG. 1b, in this example the plurality of stations 4 include a first station 4a which is defined by a multifunctional bin 4a. A reference element 8 is further provided, and is arranged to rest on the multifunctional bin 4a. The reference element 8 is arranged so that it abuts a fixed set of pins 13 (such as dowel pins) which are provided on a surface 14 of the multifunctional bin 4a. The fixed set of pins 13 provide a reference position for the reference element 8, allowing the reference element 8 to be always placed in the same position on the multifunctional bin 4a. The multifunctional bin 4a has a predefined fixed location; the location of the multifunctional bin 4a remains constant during the performance of all the method steps described hereafter. The surface 14 is perpendicular to the rotation axis 6 of the turret 2. The reference element 8 is arranged so that it overlays an input of the multifunctional bin 4a (the input is an opening through which components can be passed into the bin; in the figure the input is not visible as it is covered by the reference element 8).

In this example the reference element 8 is mechanically independent of the multifunctional bin 4a and thus may be selectively place on, or removed from the surface 14 of the multifunctional bin 4a.

A magnified view of the reference element 8 is shown in FIG. 1c. The reference element 8 comprises a plate member 11 having a plurality of holes 9 defined therein, wherein the holes 9 are configured such that there is a point 10 which is between the plurality of holes 9 which is equidistance from each of the plurality of holes 9; the point 10 defines the centre of the reference element 8. In this example the plate member 11 comprises a plurality of groups 12a-e of holes; specifically the plate member 11 comprises five groups 12a-e of three holes. The group 12a comprises holes 9a-c; the group 12b comprises holes 9d-f; the group 12c comprises holes 9g-i; the group 12d comprises holes 9j-l; the group 12e comprises holes 9m-o. Each of the holes in a particular group 12a-e have equal dimensions, but the dimensions of the holes differ between groups. The point 10 is located equidistance from the three holes of any group 12a-e.

As well as the multifunctional bin 4a the plurality of stations 4 further include a plurality of other stations 4; in this example the plurality of stations 4 further include second and third stations 4b,c at which a component can be processed and/or tested. It will be understood that any number of stations 4 may be provided, for example between 3 and 20 stations 4 may be provided, and the stations 4 may be configured to perform any suitable processing and/or testing of a component.

The third station 4c comprises a nest 5 on which a component can be supported. The third station 4c is positioned such that its nest 5 is centred under a component handling head 3 on the turret 2; consequently the nest 5 will also be centred under successive component handling heads 3 on the turret 2 as the turret 2 rotates since the component handling heads 3 are equally spaced around the rotation axis 6 of the turret 2. It will be understood that if the assembly were to comprises a plurality of stations 4 which each comprise a nest 5; it is preferred that each of those stations are positioned such that their respective nests 5 are centred under a respective component handling head 3 on the turret 2; in such a case the their respective nests 5 will also be centred under successive component handling heads 3 on the turret 2 as the turret 2 rotates since the component handling heads 3 are equally spaced around the rotation axis 6 of the turret 2.

As will be described in more detail below the reference element 8 positioned on the multifunctional bin 4a may be used to obtain a reference to which the nest 5 of the station 4c (and the nests of any other additional stations 4 which might be provided in the assembly 1) can be aligned, so as to ensure that the nest of the station 4c is centred under a respective component handling head 3 on the turret 2.

The component handling assembly 1 comprises a camera 7 which is located on the rotatable turret 2. Specifically the camera 7 is located on the turret 2 between two neighbouring component handling heads 3. The camera is positioned such that it can capture an image of a station 4 located beneath the turret, when the turret 2 is moved to a positioned whereby the camera is positioned above said station 4. The component handling assembly 1 further comprises a mirror assembly 30 which comprises one or more mirrors which are arranged to direct the field of view of the camera to be beneath the turret, so that the camera 7 can be used to capture images of the stations 4. As shown in FIG. 1b the camera 7 is arranged to be parallel to a plane of the turret 2; the mirror assembly 30 comprises a mirror arranged to deflect light, which is reflected by the reference element 8 and/or the station 4 below, into the lens of the camera 7 (in this particular example the mirror is arranged at 45° with respect to the plane of the reference element 8 so that light which is reflected by the reference element 8 and/or the station 4 below, is deflected by the mirror into the lens of the camera 7); consequently the camera 7 can capture an image of the reference element 8 and/or station 4. However it will be understood that in an alternative embodiment the camera 7 could be arranged on the turret 2 so that light which is reflected by the reference element 8 and/or the station 4 below is received directly into the lens of the camera 7; thus eliminating the need for a mirror to deflect light into the lens of the camera. In this example the camera 7 is a USB camera however it will be understood that any type of camera may be used.

As illustrated in FIG. 1a the component handling assembly 1 further comprises a processor 18. The processor is configured to, (a) initiate the camera 7 to capture a first image of a reference element 8 located on the multifunctional bin 4a;

(b) identify the position in the first image of the centre point 10 of the reference element 8;

(c) initiate the turret 2 to rotate so that the camera 7 on the turret 2 is in a position where it can capture a second image of a nest 5 of one of other stations 4; in this particular example the processor 18 is configured to initiate the turret 2 to rotate so that the camera 7 on the turret 2 is in a position where it can capture a second image of a nest 5 of the third station 4c;

(d) initiate the camera 7 to capture a second image of nest 5 of said the third station 4c;

(e) identify the position in the second image of the centre of the nest 5 of said third station 4c;

(f) superimpose a marker on the second image at the same position as the position of the centre of the reference element 8 in the first image, so that the user can identify how the third station 4c should be adjusted so that the position in the second image of the centre of the nest 5 of the station 4c is aligned with the marker. These steps a-f which are performed by the processor 18 will be described in more detail below.

The user may move the position of the third station 4c until the centre of the nest 5 of the third station 4c in the second image is aligned with the marker. In an alternative embodiment the processor 18 may initiate the automatic movement of the position of the third station 4c until the centre of the nest 5 of the third station 4c in the second image is aligned with the marker; for example the nest of the third station 4c may be provided on an x-y table and the processor 18 may initiate the movement of the x-y table so that the centre of the nest 5 of the third station 4c in the second image is aligned with the marker. When the centre of the nest 5 of the third station 4c in the second image is aligned with the marker then the nest 5 of the third station 4c will be centred under a respective component handling head 3 of the turret 2.

If the component handling assembly comprises a plurality of other stations 4 each of which comprises a nest 5; then the processor 18 is configured to perform the above-mentioned steps for each of those other stations 4 so that the respective nests 5 of each of the other stations 4 are centred under a respective component handling head 3 of the turret 2.

The processor 18 is further configured to:

initiate the camera 7 to capture a third image of a reference element 8 located on the multifunctional bin 4a;

identify the position in the third image of the centre 10 of the reference element 8;

and compare the position in the third image of the centre 10 of the reference element 8 with the position in the first image of the centre 10 of the reference element 8, so as to determine if the camera 7 has become displaced during the period between when the first image captured and when the third image was captured. The processor 18 can determine that the camera 7 has become displaced during the period between when the first image captured and when the third image was captured if the position in the third image of the centre 10 of the reference element 8 is not the same as the position in the first image of the centre 10 of the reference element 8.

The component handling assembly 1 can be used to perform a method for adjusting a component handling assembly according to an embodiment of the present invention. The method for adjusting a component handling assembly comprises the steps of, (a) capturing a first image of the reference element 8 located on the multifunctional bin 4a, using a camera 7 which is located on the rotatable turret 2;

(b) identifying the position in the first image of the centre 10 of the reference element 8;

(c) rotating the turret 2 to a position where the camera 7 on the turret 2 is in a position where it can capture a second image of a nest of another station; in this example the turret 2 is rotated to a position where the camera 7 on the turret 2 is in a position where it can capture a second image of the nest 5 of the third station 4c;

(d) capturing a second image of nest 5 of the third station 4c, using said camera 7;

(e) identifying the position in the second image of the centre of the nest 5 of the third station 4c;

(f) superimposing a marker on the second image at the same position as the position of the centre 10 of the reference element 8 in the first image;

(g) adjusting the third station 4c until the position of the centre of the nest 5 of the third station 4c in the second image is aligned with the marker. When the centre of the nest 5 of the third station 4c in the second image is aligned with the marker then the nest 5 will be centred under a respective component handling head 3 on the turret 2.

It will be understood that this the method could be applied to any number of station 4 which are provided in the assembly 1. For example, if the assembly 1 were to comprise twenty stations 4, in addition to the multifunctional bin 4a, each of which comprising a nest 5, then the steps (a)-(g) can be applied to each of those twenty stations 4 so as to align the nests 5 of the stations 4 with a respective component handling head 3 on the turret 2.

The first and second images have the same field of view. In one embodiment the camera 7 is configured to have a fixed field of view, thus the first and second images will have the same field of view. In another embodiment the focus of the camera 7 is adjustable so that the field of view can be changed, and the method will then include a step of checking that the field of view of the camera is set to a predefined level prior to capturing the first image and second images; for example the method may include a step of checking that the field of view of the camera is set to a predefined level prior to capturing the first image; if the field of view of the camera is not at the predefined level then adjusting the camera focus until the field of view of the camera is set to a predefined level; then capturing the first image; and then, prior to capturing the second image, checking that the field of view of the camera 7 is equal to the field of view which the camera had when taking the first image. If the field of views are equal then the second image is captured. If the field of view of the camera 7 is not equal to the field of view which the camera had when taking the first image, then the first image must be recaptured (the turret is rotated back to allow the camera to recapture the first image), and prior to capturing the second image, checking that the field of view of the camera 7 is equal to the field of view which the camera 7 had when taking the recaptured first image. The second image is not captured until the field of view of the camera 7 is equal to the field of view which the camera had when taking the first image; thus the steps of recapturing the first image and checking, prior to capturing the second image, that the field of view of the camera 7 is equal to the field of view which the camera had when taking the recaptured first image are repeated until the field of views are the same.

In another embodiment the prior to capturing the second image, if the field of view of the camera 7 is not equal to the field of view which the camera had when taking the first image (i.e. if the field of view of the camera is not at the predefined level), then then the camera focus is adjusted until the field of view of the camera is set to be equal to the field of view which the camera had when taking the first image (i.e. is set to said predefined level).

Preferably the camera 7 is configured to provide live video streaming of the nest 5 of the third station 4c. The second image may be an image frame of a video, for example the second image may be an image frame of live video. For example, camera may provide live video of the third station 4c which shows the nest 5 of the third station 4c; the marker may be superimposed on all image frames of the live video; the user may adjust the third station 4c until the position of the centre of the nest 5 of the third station 4c in the image frames of the live video is aligned with the marker. Importantly the second image has the same field of view as the first image. For example each of the image frames in the live video will have the same field of view as the first image.

An exemplary embodiment of the method will now be described making reference to FIG. 1a-7. In a first step in the embodiment the reference element 8, which is mechanically independent of the multifunctional bin 4a, is positioned on the surface 14 of the bin 4a so that it abuts a fixed set of pins 13 and overlays an input of the multifunctional bin 4a. Next, as illustrated in FIG. 1b, first image of the reference element 8 located on the multifunctional bin 4a, is captured using a camera 7 which is located on the rotatable turret 2; the features illustrated in FIG. 1b have already been described above. As shown in FIG. 1b the turret is moved so that the camera 4 is positioned directly above the multifunctional bin 4a, and more specifically aligned above the reference element 8 which abuts the pins 13.

Figure 2:
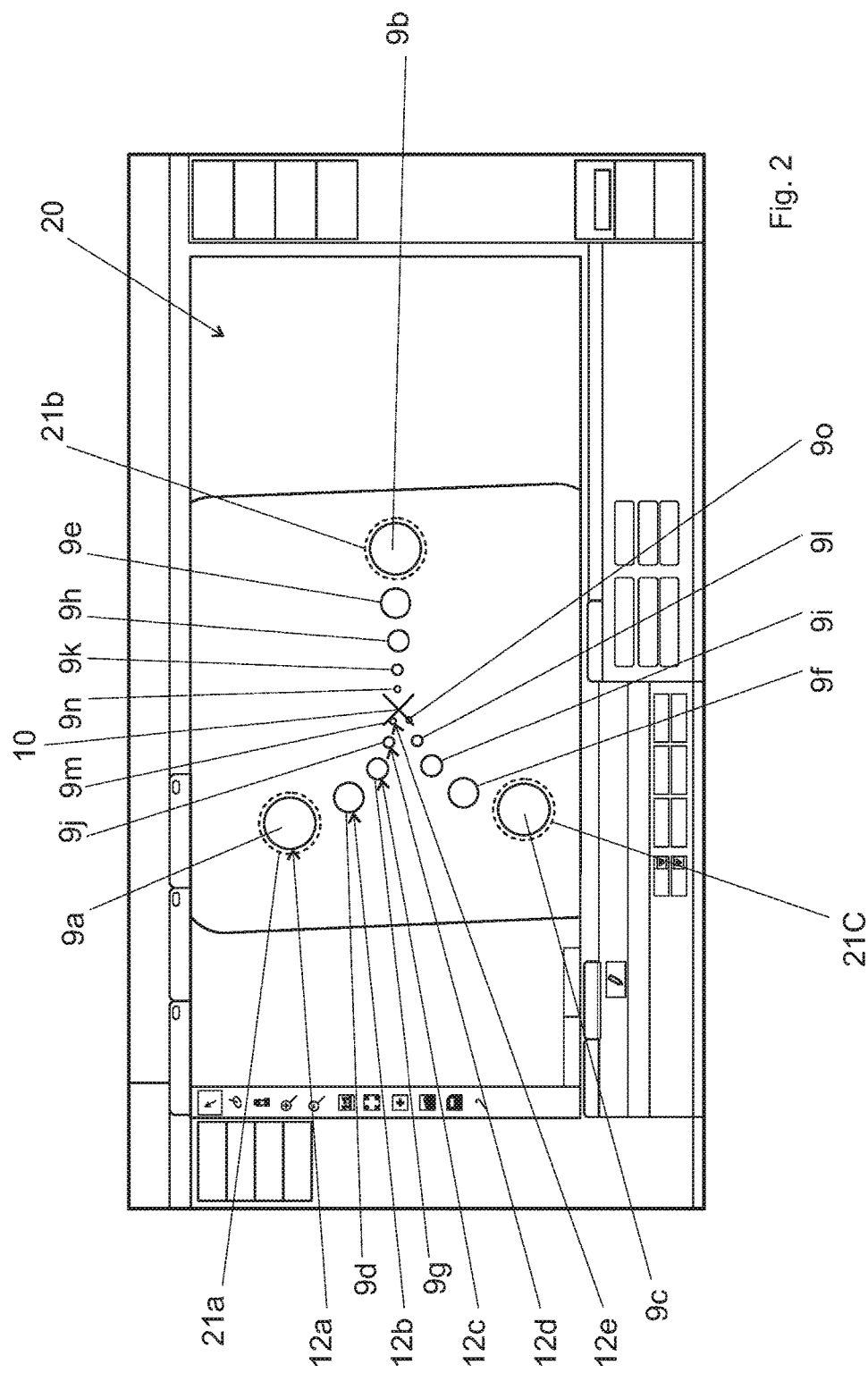
FIG. 2 shows an example of a first image of a reference element which is captured by the camera of the assembly in FIGS. 1a&b.

FIG. 2 shows an example of a first image 20 of the reference element 8 which is captured by the camera 7. Next, the position in the first image 20 of the centre 10 of the reference element 8 is identified. In this example this is achieved by selecting from the plurality of groups 12a-e of holes 9a-o which are visible on the first image 20, a group 12a-e of holes 9a-o which are to be used to calculate the location in the first image 20 of the centre 10 of the reference element 8. In this case the first image 20 is of such a resolution that all groups 12a-e of holes 9a-o are visible so the user could select to use any of the groups 12a-e of holes 9a-o. However in other embodiments the resolution may be such that only groups of holes 12d and 12e are visible on the first image, in which case the user could only select between groups of holes 12d and 12e to be used to calculate the location in the first image 20 of the centre 10 of the reference element 8. In this example the group of holes 12a, which consists of holes 9a-c, are selected to be used to calculate the location in the first image 20 of the centre 10 of the reference element 8.

The position of the holes 9a-c in the first image 20 in then identified. It will be understood that it is the position of the holes in the selected group which is identified. This can be achieved by means of performing grey scale analysis such as, providing the grey level of each pixel in the first image 20 and then identifying the location of the holes 9a-c based on the grey levels of the pixels. When the first image 20 is represented in grey scale, the "black" pixels in the grey scale of the first image represent the areas of the holes 9a-c and "white" pixels in the grey scale of the image will represent the other areas of the reference element 8 in the first image 20. Therefore the position of the holes 9a-c in the first image 20 can be identified by identifying the "black" pixels in the grey scale representation of the first image 20. The method preferably involves defining some minimum threshold grey level threshold below which a pixel is considered to be "white" and a maximum threshold grey level threshold above which a pixel is considered to be "black". In another embodiment the position of the holes 9a-c in the first image is identified by finding the areas in the in the grey scale representation of the first image 20 where there is adjacent "white" and "black" pixels; these areas will represent the border of the holes 9a-c. the areas of the first image 20 where there is a large change (i.e. above a predefined threshold e.g. above 30 GV) in grey scale level between adjacent pixels will indicate the border of a hole 9a-c; thus the location of the holes 9a-c can be identified by identifying the regions in the grey scale representation of the first image 20 where the change in grey scale level between adjacent pixels is above a predefined threshold. In other words, the position of the holes 9a-c in the first image may be identified by identifying consecutive pixels in which difference between in the grey values between the consecutive pixels is least 30 GV (black to white scale goes from 0 to 256 GV (grey values)); these adjacent pixels can be recognized as depicting the a border of the holes 9a-c. In a further embodiment.

An image analysis tool may be used to aid in the location of the holes 9a-c; for example tools which look for specific patterns (e.g. straight line, ellipse, curves or circle) in the grey scale values of the pixels. In the present example image analysis tool which is configured to locate circular patterns in the in the grey scale values of the pixels; in other words the image analysis tool can locate a circular pattern formed by a series of pairs of adjacent pixels whose grey value differs by at least 30 GV; by locating such a pattern the boarder of a hole 9a-c can be located. It is further possible to select pixels which are to be excluded from consideration by the image analysis tool. The image analysis tool can further use some predefined parameters like radius of the holes 9a-c, diameter of the holes 9a-c, centre of gravity etc. to help locate the position in the first image of the holes 9a-c.

It should be understood that any other suitable image analysis can be used to identify the location of the holes 9a-c in the first image 20; the invention is not limited to using a grey scale analysis.

The position of the centre 10 of the reference element 8 in the first image 20 may then be determined; this can be done by determining the position of the centre of the identified holes 9a-c using the previously identified location of the holes 9a-c in the first image 20 and predetermined known parameters such as diameter, radius and distances between the holes 9a-c in the physical reference element 8. Then performing a geometrical calculation using the position of the centre of the identified holes 9a-c and predetermined known parameters to determine the location in the first image 20 of the centre 10 of the reference element 8.

Similarly the location in the first image 20 of the centre 10 of the reference element 8 can equally be determined using circular marker 21a-c. FIG. 2 shows the holes 9a-c having already been located, and their respective locations marked with respective circular markers 21a-c each of which align with the borders of a respective hole 9a-e. After the position of the holes 9a-c in the first image 20 has been identified a geometrical calculation is performed to located a point which is between the circular markers 21a-c and equidistance from each circular marker 21a-c; this point corresponds to a point which is between the plurality of holes 9a-c and is equidistance from each of the plurality of holes 9a-c; this point also corresponds to the location in the first image 20 of the centre 10 of the reference element 8. In order to perform the geometrical a frame of reference in the first image 20 is defined and x-coordinates ((X1, X2, X3), wherein X1 is the x-coordinate of the centre of the circular marker 21a, X2 is the x-coordinate of the centre of the circular marker 21b, X3 is the x-coordinate of the centre of the circular marker 21c) and y-coordinates ((Y1, Y2, Y3), wherein Y1 is the y-coordinate of the centre of the circular marker 21a, Y2 is the y-coordinate of the centre of the circular marker 21b, Y3 is the y-coordinate of the centre of the circular marker 21c) for each of the circular markers 21a-c in the first image 20 with respect to this frame of reference is identified determined. The location of centre 10 in the first image 20 can then be determined using these x-coordinates and y-coordinates as follows:

[Xcenter=(X1+X2+X3)/3]

[Ycenter=(Y1+Y2+Y3)/3]

wherein the centre 10 is of the reference element 8 in the first image 20 is at coordinates (Xcenter, Ycenter) in the defined frame of reference. It should be understood that the present invention is not limited to identifying the centre 10 in this manner, and that any other suitable techniques may be used.

Figure 3:
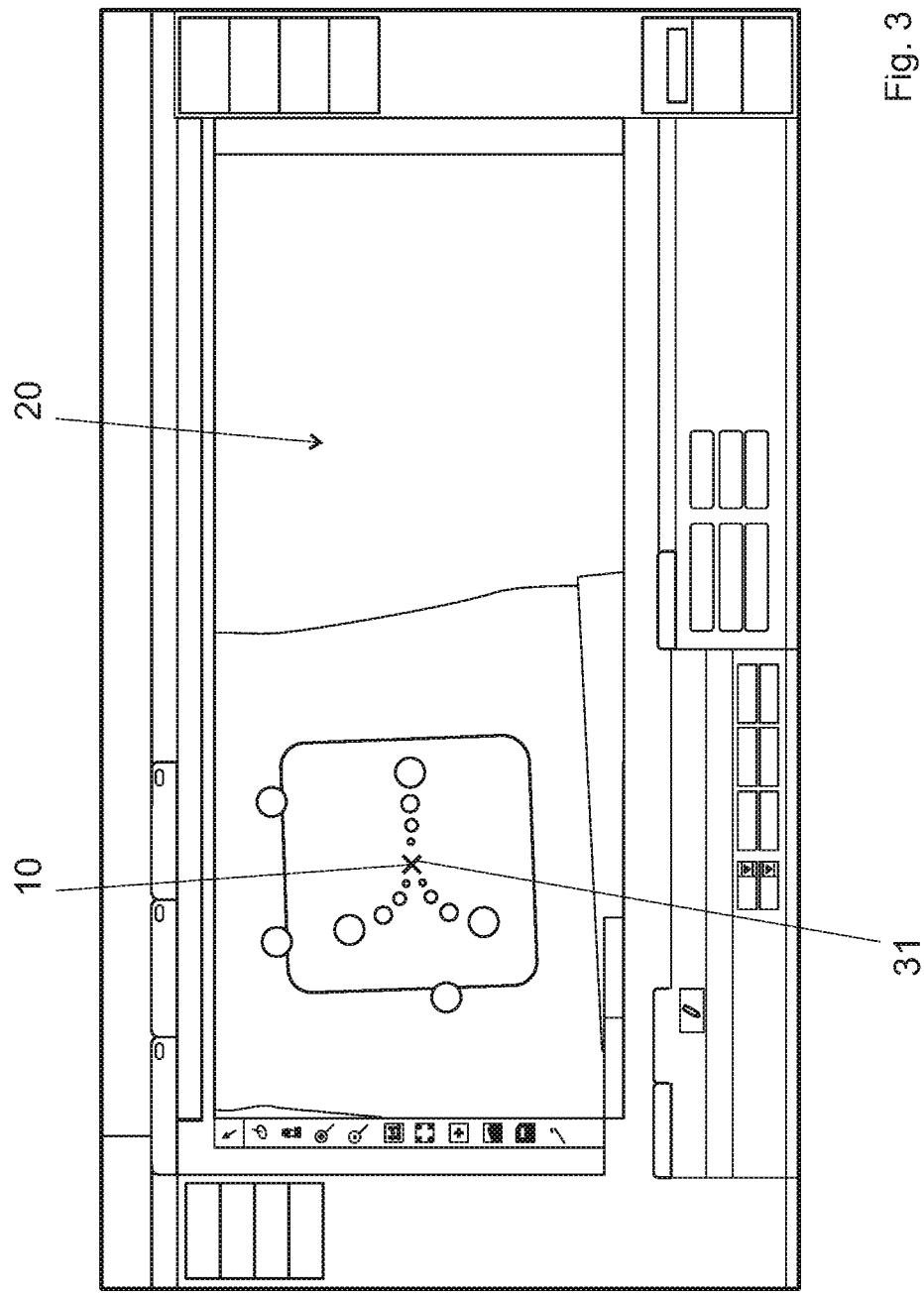
FIG. 3 shows the first image of FIG. 2 with position of the centre of the reference element marked with a first "x" marker.

FIG. 3 illustrates the first image 20 after the geometrical calculation has been performed to locate a point which is between the circular markers 21a-c and equidistance from each circular marker 21a-c. The calculated point, which corresponds to the location in the first image 20 of the centre 10 of the reference element 8, is marked with a first "x" marker 31.

Figure 4:
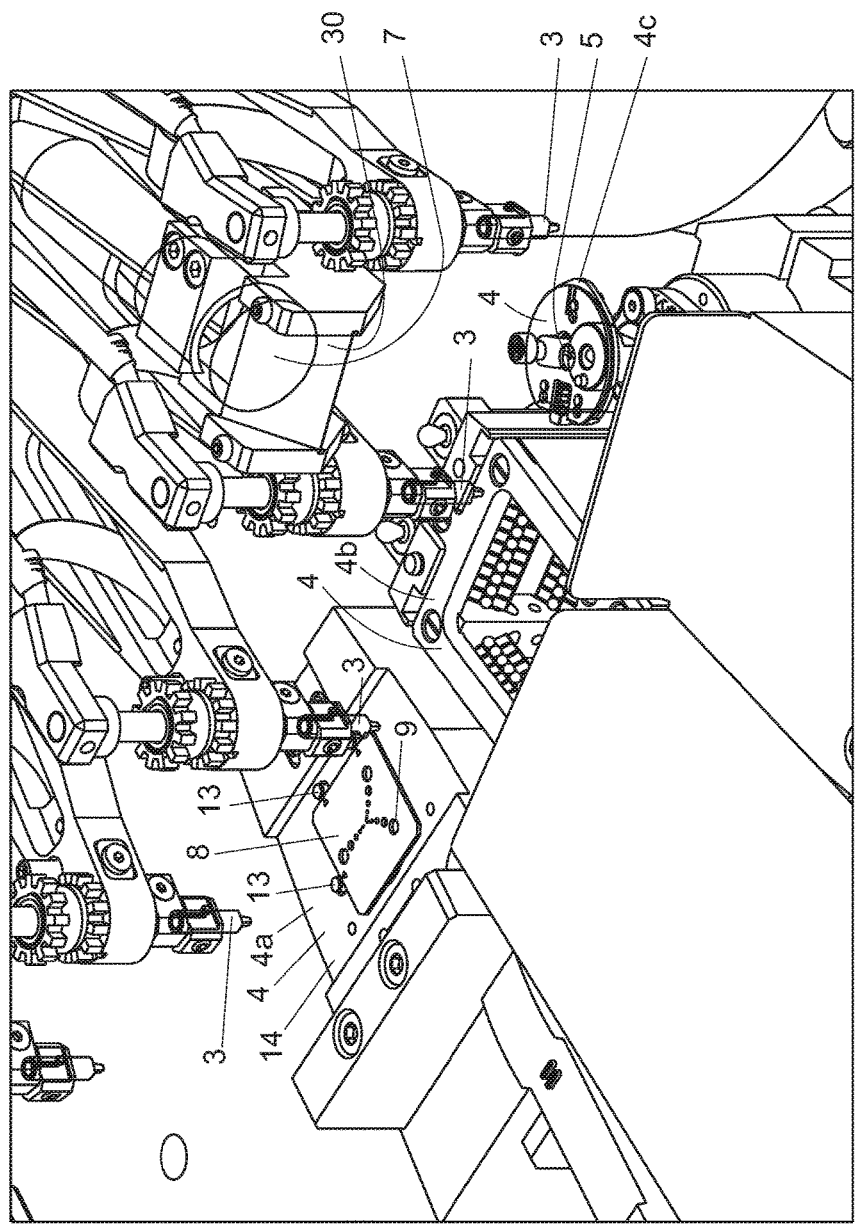
FIG. 4 shows illustrates the turret after it has been rotated to a position where the camera can capture a second image of a nest of a third station in the assembly.

The turret 2 is then rotated to a position where the camera 7 on the turret 2 can capture a second image of a nest of another station. As illustrated in FIG. 4, in this example the turret 2 is rotated to a position where the camera 7 on the turret 2 is in a position where it can capture a second image of the nest 5 of the third station 4c. The step of rotating the turret 2 to a position where the camera 7 on the turret 2 is in a position where it can capture a second image of nest 5 of a third station 4c involves rotating the turret 2 to a position where the camera 7 is aligned above the nest 5 of the third station 4c. Since the camera 7 is located between consecutive components handling heads 3 of the turret 2 the turret 2 is rotated through angle of rotation which is equal to one-and-half times the angle between the consecutive component handling heads 3 of the turret 2.

In this example the second station 4b does not include a nest 5; however it should be understood that typically the second station 4b will also include a nest 5, in which case turret 2 would be rotated to a position where the camera 7 on the turret 2 can capture a second image of a nest of the second station, and the method of the present invention would be performed on the second station 4b, before performing the method of the present invention on the third station 4c. In this case the step of rotating the turret 2 to a position where the camera 7 on the turret 2 is in a position where it can capture a second image of nest of a second station 4b which is adjacent to the multifunctional bin 4a involves moving the rotating the turret 2 to a position where the camera 7 is aligned above the nest of a second station 4b. Since the camera 7 is located between consecutive components handling heads 3 of the turret 2 the turret 2 would thus be rotated through angle of rotation which is equal to half the angle between the consecutive component handling heads 3 of the turret 2; after the method of the present invention would be performed on the second station 4b the turret 2 would again be rotated through angle of rotation which is equal to half the angle between the consecutive component handling heads 3 so that the camera 7 on the turret 2 is in a position where it can capture a second image of the nest 5 of the third station 4c.

A second image of nest 5 of the third station 4c is then captured using said camera 7. FIGS. 5a & 5b illustrate a second image 50 of the third station 4c. The camera 7 is configured to provide live video streaming of the nest 5 of the third station 4c. The second image 50 which is shown in FIGS. 5a and 5b is thus an image frame of live video streaming.

The second image 50 is then processed to identifying the position in the second image 50 of the centre 51 of the nest 5 of the third station 4c. Any suitable image analysis and/or geometrical calculations can be performed to identify the position in the second image 50 of the centre 51 of the nest 5 of the third station 4c. In this example the centre 51 of the nest 5 of the third station 4c is determined by providing the grey level of each pixel in the second image 50; identifying a border/outer perimeter 41 of the nest 5 in the second image 50 based on the grey levels of the pixels (e.g. by identifying the regions where the change in grey level between adjacent pixels is above a predefined threshold); and then performing a suitable geometrical calculation (depending on the shape of the nest 5) to determine a point which is at the centre of the identified border, wherein the determined point defines the centre 51 of the nest 5. In this example the second image 50 is processed in a similar fashion to the first image 20 so as to determine the location of the centre 51 of the nest 5; so it will be understood that any of the steps described above with respect to processing the first image 20 may equally be applied to process the second image 50.

More specifically in this example the second image 50 is represented in grey scale; in the grey scale representation of the second image 50 the nest 5 will appear as "black" pixels in the grey scale of the second image and the rest of the third station will appear as "white" (and/or grey) pixels. The method preferably involve defining some maximum threshold grey level threshold above which a pixel is considered to be "black". The areas in the grey scale representation of the second image 50 where there is adjacent "white" and "black" pixels are then identified; these areas represent the border/outer perimeter 41 of the nest 5. (In another embodiment areas in the grey scale representation of the second image 50 where the change in grey scale level between adjacent pixels is above a predefined threshold is identified.)

In the example illustrated in FIGS. 5a and 5b, the nest 5 is a quadrilateral shaped. Thus, after the areas in the grey scale representation of the second image 50 where there is adjacent "white" and "black" pixels have been identified, a Least Mean Square fitting method (LMS) is performed to find the square/rectangle which best fits to the identified areas (i.e. which best fits to the border/outer perimeter). It will be understood that the nest 5 may be any other suitable shape and the appropriate mean square fitting method (LMS) is performed depending on the shape of the nest 5 to be fitted.

Next a geometrical a frame of reference in the second image 50 is defined; and x-coordinates and y-coordinates for the position of the nest 5 in the second image 50 with respect to the defined frame of reference. The frame of reference define in the second image 50 is identical to the frame of reference which was defined in the first image 20. Using the shape of the nest which was determined using the least mean square method and the x & y-coordinates, the position in the second image 50 of the centre of the nest 5 is determined using suitable geometrical calculations (for example, if the least mean square method determines that the shape of the nest 5 is a square and the x & y-coordinates of the corners of the nest, in the frame of reference, are determined to be at (0,0), (0,1), (1,1), (1,0) then the centre of the nest 5 can be geometrically calculated to be at x & y-coordinates (0.5,0.5).

It should be understood that any other suitable image analysis and techniques can be used to identify the position in the second image 50 of the nest 5; the invention is not limited to using the above-mentioned technique.

The centre 51 of the nest in then marked with a second "x" marker 52 as is illustrated in FIG. 5a.

As is illustrated also in FIG. 5a the first "x" marker 31 is then superimposed a marker on the second image 50 at the same position as the position of the centre 10 of the reference element 8 in the first image. The second image 50 is an image frame of a live video stream of the nest 5 of the third station 4c; the first "x" marker 31 is thus superimposed on all image frames of the live video stream. Importantly the second image is has the same field of view as the first image this allows the first "x" marker 31 to be superimposed on the second image 50 at the same position as the position of the centre 10 of the reference element 8 in the first image.

In an embodiment the distance 'd' between the first "x" marker 31 and second "x" marker 52 is determined to estimate a positioning error of the third station 4c and/or the position error of the nest 5 of the third station 4c. In FIGS. 5a and 5b the first "x" marker 31 is illustrated being thicker than the second "x" marker 52 so that both markers can be distinguished; in practice the markers 31,52 may have different colours to allow them to be distinguished.

The position of the third station 4c and/or the position of the nest 5 of the third station 4c is moved until the position in the second "x" marker 52 is aligned with the first "x" marker 31 in the second image 50. As the position of the third station 4c and/or the position of the nest 5 of the third station 4c is moved the location in the second image 50 of the centre 51 of the nest 5 is calculated in real time so that the position of the second "x" marker 52 in the second image 50 follows the position of the centre 51 of the nest 5.

The moving of the position of the third station 4c and/or moving the position of the nest 5 of the third station 4c may be done manually and/or automatically. For example a user may manually adjust the position of the third station 4c and/or may manually adjust the position of the nest 5 of the third station 4c; and/or a means for automatically adjusting the position of the third station 4c and/or the position of the nest 5 of the third station 4c may be used (such as an x-y table for example). In the latter case for example the method would comprises the step of using an x-y table to move the nest 5 of the third station 4c and/or to move the third station 4c as a whole, so that the centre of the nest 5 of the third station 4c is aligned with the marker.

FIG. 5b shows the second image 50 after the third station 4c and/or the nest 5 of the third station 4c has been moved so that the position of the second "x" marker 52 is aligned with the first "x" marker 31. In this position the nest 5 of third station 4c will be aligned directly under a respective component handling head 3 on the turret 2; and as the turret 2 rotates the nest 5 of the third station 4c will also be aligned directly under successive component handling head 3 on the turret 2.

These steps are repeated for all stations 4 which are provided in the component handling assembly 5, so that the nests of those stations 4 are aligned directly under a respective component handling head 3 on the turret 2.

After the above-mentioned steps have been performed on all stations 4 so that those stations 4 are adjusted, the turret is rotated to the position which it had when the camera 7 captured the first image. The camera 7 is then operated to capture a third image of the reference element 8 located on the multifunctional bin 4a. The position in the third image of the centre point 10 of the reference element 8 is identified using the same steps are were used to identify the position in the first image of the centre point 10 of the reference element 8.

Figure 6:
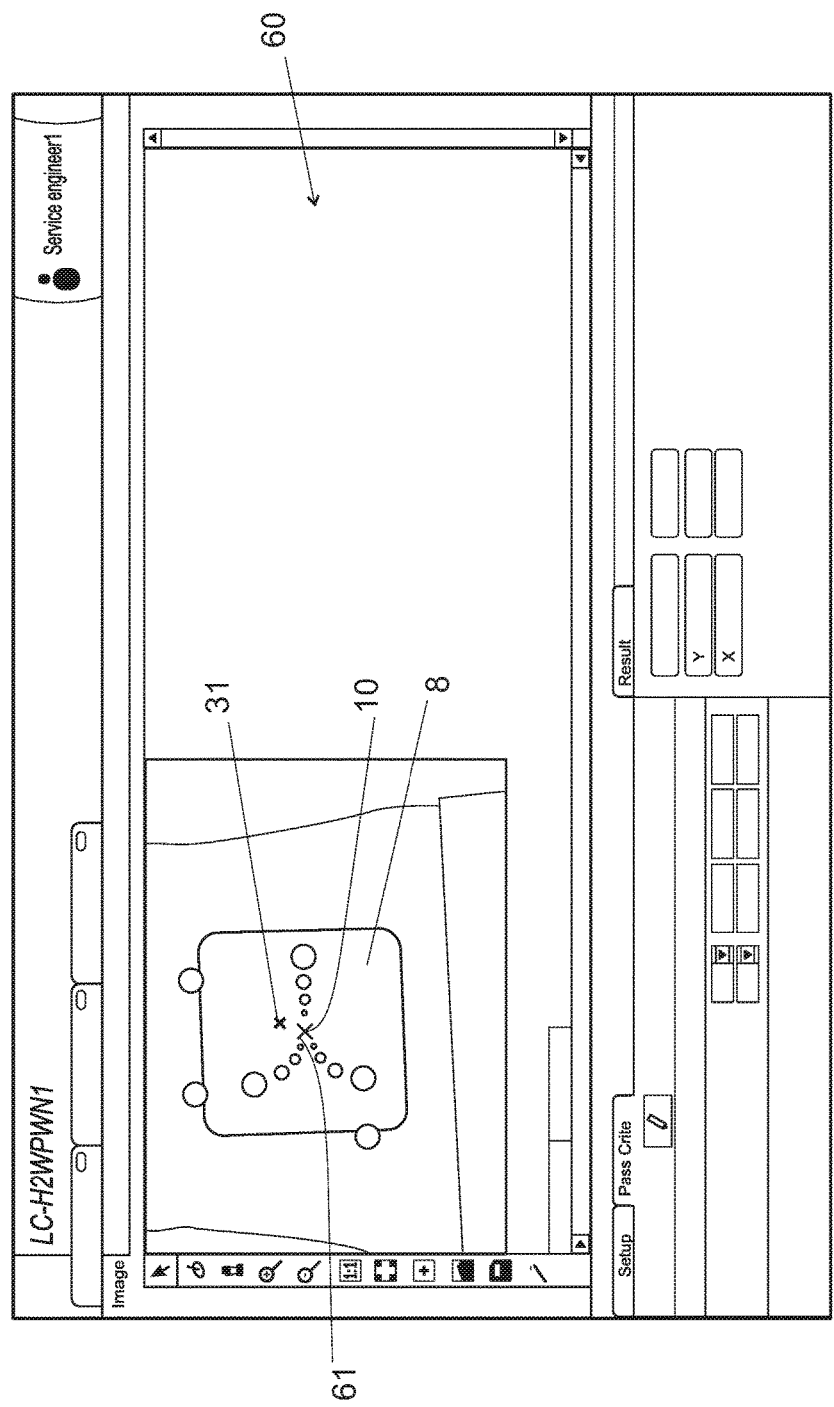
FIG. 6 shows a third image captured by the camera in which the centre point of the reference element in the image is marked with a third "x" marker.

FIG. 6 shows as example of a third image 60 in which the position of the centre point 10 of the reference element 8 in the third image has been identified and marked with a third "x" marker 61. The position in the third image 60 of third "x" marker 61 is compared with the with the position in the first image 20 of first "x" marker 31, so as to determine if the camera 7 has become displaced during the period between when the first image captured and when the third image was captured. In this example the first "x" marker 31 may be superimposed on the third image 60 at the same position as the position of the centre 10 of the reference element 8 in the first image; if the first and third "x" markers 31,61 fail to align when the first "x" marker 31 is superimposed on the third image 60 then this indicates that the camera 7 has become displaced during the period between when the first image 20 was captured and when the third image was captured. FIG. 6 shows the first "x" marker 31 superimposed on the third image 60 at the same position as the position of the centre 10 of the reference element 8 in the first image 20; the first and third "x" markers 31,61 fail to align indicating that the camera 7 has become displaced during the period between when the first image 20 was captured and when the third image 60 was captured. In another embodiment the third image 60 and first image 20 may be overlapped and if the first and third "x" markers 31,61 fail to align when the third and first images 60,20 are overlapped then this indicates that the camera 7 has become displaced during the period between when the first image captured and when the third image was captured.

If the camera 7 has become displaced during the period between when the first image captured and when the third image was captured the positions of the stations 4 in the assembly will need to be adjusted once again; thus if the comparison of the first and third images indicates that the camera has become displaced during the period between when the first image captured and when the third image was captured, then the above-mentioned steps are repeating on each of the stations 4 of the assembly 1 so that the positioned of the nest 5 of each of the stations 4 are aligned once again.

Figure 7:
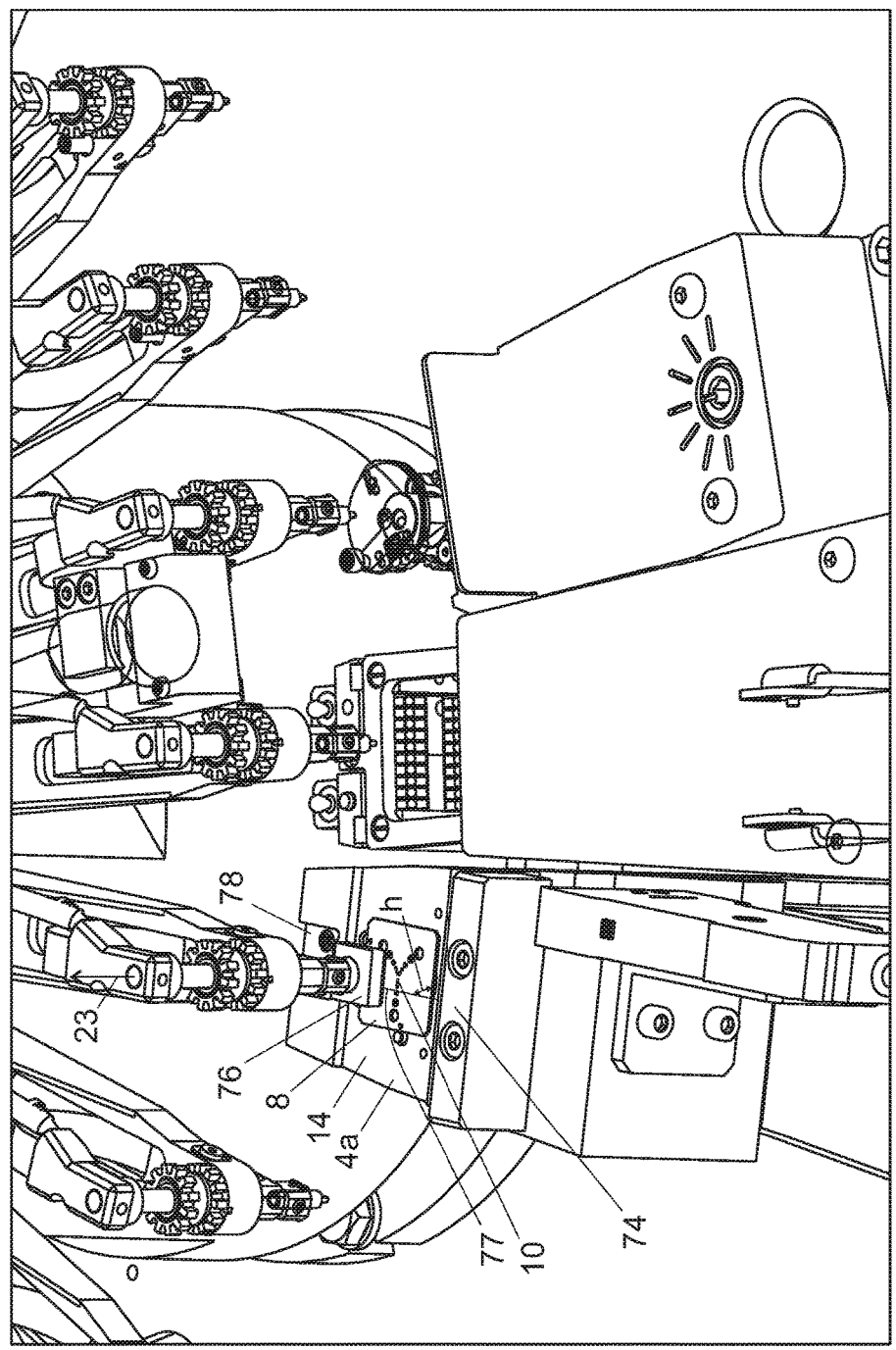
FIG. 7 shows steps involved in calibrating the movement of a component handling head on the turret.

Finally, referring to FIG. 7 it is illustrated that the component handling heads 3 on the turret are each configured such that they can extend from the turret 2 along an axis 23 towards a respective station 4. The method of adjusting the assembly 1 may further comprise the optional step of adjusting one or more of the component handling heads 3 on the turret 2:

The method of the present invention may further comprise the optional step of adjusting the position of a component handling head 3 on the turret 2 so that the axis 23 along which the component handling head 3 can extend intersects the centre point 10 of the reference element 8. The position of the component handling heard 3 on the turret 2 may be manually adjusted or may be automatically adjusted using suitable adjusting means.

In another embodiment the method may further optionally comprise calibrating the movement of the component handling head 3 on the turret 2, as is also illustrated in FIG. 7. In the example illustrated in FIG. 7 this calibration of the movement of the component handling head 3 on the turret 2 involves, holding a rubber component 76 which has a predefined dimension using the component handling head 3 to be calibrated; operating a light emitter 74 which is located on the multifunctional bin 4a so that it emits a light beam 77 which is received by a light receiver 78 on the multifunctional bin 4a, wherein the light beam 77 is arranged to be at a predefined height "h" above a surface 14 of the multifunctional bin 4a. Next the component handling head 3 is advanced towards the surface 14 of the multifunctional bin 4a only until the rubber component 76 intersects the light beam 77 to block the light beam 77 from passing from the light emitter 74 to the light receiver 78; setting the component handling assembly 1 so that the component handling head 3 is prevented from advancing beyond the position where the rubber component 76 which it held intersected the light beam 77.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A method for adjusting a component handling assembly, the component handling assembly comprising, a plurality of stations at least some of which have a nest which can receive a component, and a rotatable turret having a plurality of component handling heads, and wherein the turret can rotate to transport components between the plurality of stations, the method comprising the steps of,
   capturing a first image of a reference element located at a first station, using a camera which is located on the rotatable turret;
   identifying the position in the first image of the center of the reference element;
   rotating the turret so that the camera on the turret is in a position where it can capture a second image of nest of a second station;
   capturing a second image of the nest of the second station, using said camera;
   identifying the position in the second image of the center of the nest of the second station;
   superimposing a marker on the second image at the same position as the position of the center of the reference element in the first image; and adjusting the second station until the position in the second image of the center of the nest of the second station is aligned with the marker.

2. A method according to claim 1 wherein the second image is an image frame in a live video of the second station, and wherein said step of superimposing a marker on the second image comprises superimposing a marker on each of the image frames in the live video at the same position as the position of the center of the reference element in the first image.

3. A method according to claim 1 wherein the first and second images have the same field of view.

4. A method according to claim 1 wherein the step of adjusting the second station until the position in the second image of the center of the nest of the second station is aligned with the marker, comprises the step of using an x-y table to move the nest of the second station so that the center of the nest of the second station is aligned with the marker.

5. A method according to claim 1 wherein the method further comprises the step of, determining the distance between the marker superimposed on the second image and the position in the second image of the center of the nest of the second station, to estimate a positioning error of the second station.

6. A method according to claim 1 wherein the reference element comprises a plate member having a plurality of holes defined therein, and wherein the step of identifying the position in the first image of the center of the reference element comprises, identifying the position in the first image of the plurality of holes; and performing a geometrical calculation to locate a point in the first image which is equidistance from each of the plurality of holes, wherein said located point defines the center of the reference element.

7. A method according to claim 1 wherein the plate member comprises a plurality of groups of holes, the holes of each group having equal dimensions, the dimensions of the holes differing between groups, and wherein the step of identifying the position in the first image of the center of the reference element further comprises, selecting from the plurality of groups of holes, a group of holes on which to perform said geometrical calculation.

8. A method according to claim 1 wherein the step of identifying the position in the second image of the center of the nest of the second station comprises the steps of, providing the grey level of each pixel in the second image; identifying, based on the grey levels of the pixels, the perimeter of the nest in the second image; and performing a geometrical calculation to determine a point which is at the center of the identified perimeter, wherein the determined point defines the center of the nest.

9. A method according to claim 1 wherein the first station comprises a fixed set of pins which define a predefined position for the reference element, and wherein the method further comprises the step of,
positioning a reference element at the first station so that the reference element abuts a fixed set of pins of the first station so that the reference element is in said predefined position.

10. A method according to claim 1 wherein the method further comprises the steps of, capturing a third image of a reference element located at a first station, using the camera which is located on the rotatable turret; identifying the position in the third image of the center of the reference element; superimposing a marker on the third image at the same position as the position of the center of the reference element in the first image, and determining if the camera has become displaced during the period between when the first image captured and when the third image was captured based on whether the superimposed marker is aligned with the position in the third image of the center of the reference element.

11. A method according to claim 1 wherein the component handling head is configured such that it can extend from the turret along an axis, and wherein the method further comprises the step of, adjusting the position of a component handling head so that the axis along which the component handling head can extend intersects the center of the reference element.

12. A method according to claim 1 wherein the method further comprises the step of calibrating a component handling head on the turret by,
holding a component which has a predefined dimension using the component handling head to be calibrated;
operating a light emitter at a station beneath the component handling head so that it emits a light beam which is received by a light receiver at the station, wherein the light beam is arranged to be at a predefined height above a surface of the station;
advancing the component handling head towards a station only until the component intersects the light beam to block the light beam from passing from the light emitter to the light receiver; and
setting the component handling assembly so that the component handling head is prevented from advancing beyond the position where the component which it held intersected the light beam.

13. A component handling assembly comprising, a plurality of stations at least some of which have a nest which can receive a component, wherein the plurality of stations include a first station which comprises a reference element and a second station which comprises a nest;
a rotatable turret having a plurality of component handling heads, wherein the turret can rotate to transport components between the plurality of stations;
a camera which is located on the rotatable turret; and
a processor which is configured to,
(a) initiate the camera to capture a first image of a reference element located at a first station;
(b) identify the position in the first image of the center of the reference element;
(c) initiate the turret to rotate so that the camera on the turret is in a position where it can capture a second image of nest of a second station;
(d) initiate the camera to capture a second image of nest of the second station;
(e) identify the position in the second image of the center of the nest of the second station; and
(f) superimpose a marker on the second image at the same position as the position of the center of the reference element in the first image, so that the user can identify how the second station should be adjusted so that the position in the second image of the center of the nest of the second station is aligned with the marker.

14. A component handling assembly according to claim 13, wherein the camera is located on the turret between consecutive component handling heads.

15. A component handling assembly according to claim 13 wherein the reference element comprises a plate member having a plurality of holes defined therein.

16. A component handling assembly according to claim 14 wherein the reference element comprises a plate member having a plurality of holes defined therein.

* * * * *